(12) United States Patent
Merassi et al.

(10) Patent No.: US 8,124,895 B2
(45) Date of Patent: Feb. 28, 2012

(54) PLANAR MICROELECTROMECHANICAL DEVICE HAVING A STOPPER STRUCTURE FOR OUT-OF-PLANE MOVEMENTS

(75) Inventors: Angelo Merassi, Vigevano (IT); Mario Francesco Cortese, San Donato Milanese (IT); Viola Fulvio, Settimo Milanese (IT); Barbara Simoni, Leghorn (IT); Andrea Rusconi Clerici Beltrami, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 407 days.

(21) Appl. No.: 12/359,556

(22) Filed: Jan. 26, 2009

(65) Prior Publication Data
US 2009/0194397 A1      Aug. 6, 2009

Related U.S. Application Data

(63) Continuation-in-part of application No. PCT/IT2006/000576, filed on Jul. 26, 2006.

(51) Int. Cl.
*H01H 35/14*      (2006.01)

(52) U.S. Cl. .................................................. 200/61.53

(58) Field of Classification Search ............... 200/61.53, 200/52 R; 73/526, 514.14
See application file for complete search history.

(56) References Cited

U.S. PATENT DOCUMENTS

| | | | |
|---|---|---|---|
| 5,121,633 A | 6/1992 | Murakami et al. |
| 6,360,605 B1 | 3/2002 | Pinter et al. |
| 6,528,724 B1 | 3/2003 | Yoshida et al. |
| 6,634,232 B1 | 10/2003 | Rettig et al. |

FOREIGN PATENT DOCUMENTS

| | | |
|---|---|---|
| DE | 40 16 472 A1 | 11/1991 |
| EP | 1203748 B1 | 5/2007 |

*Primary Examiner* — Vanessa Girardi
(74) *Attorney, Agent, or Firm* — Seed IP Law Group PLLC

(57) ABSTRACT

A microelectromechanical device has a mobile mass that undergoes a movement, in particular a spurious movement, in a first direction in response to an external event; the device moreover has a stopper structure configured so as to stop said spurious movement. In particular, a stopper element is fixedly coupled to the mobile mass and is configured so as to abut against a stopper mass in response to the spurious movement, thereby stopping it. In detail, the stopper element is arranged on the opposite side of the stopper mass with respect to a direction of the spurious movement, protrudes from the space occupied by the mobile mass and extends in the space occupied by the stopper mass, in the first direction.

34 Claims, 4 Drawing Sheets

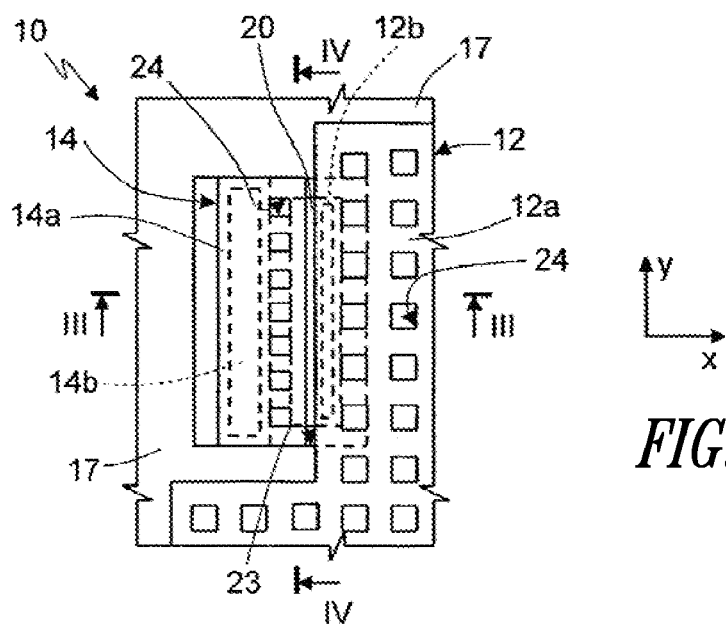
FIG. 3A
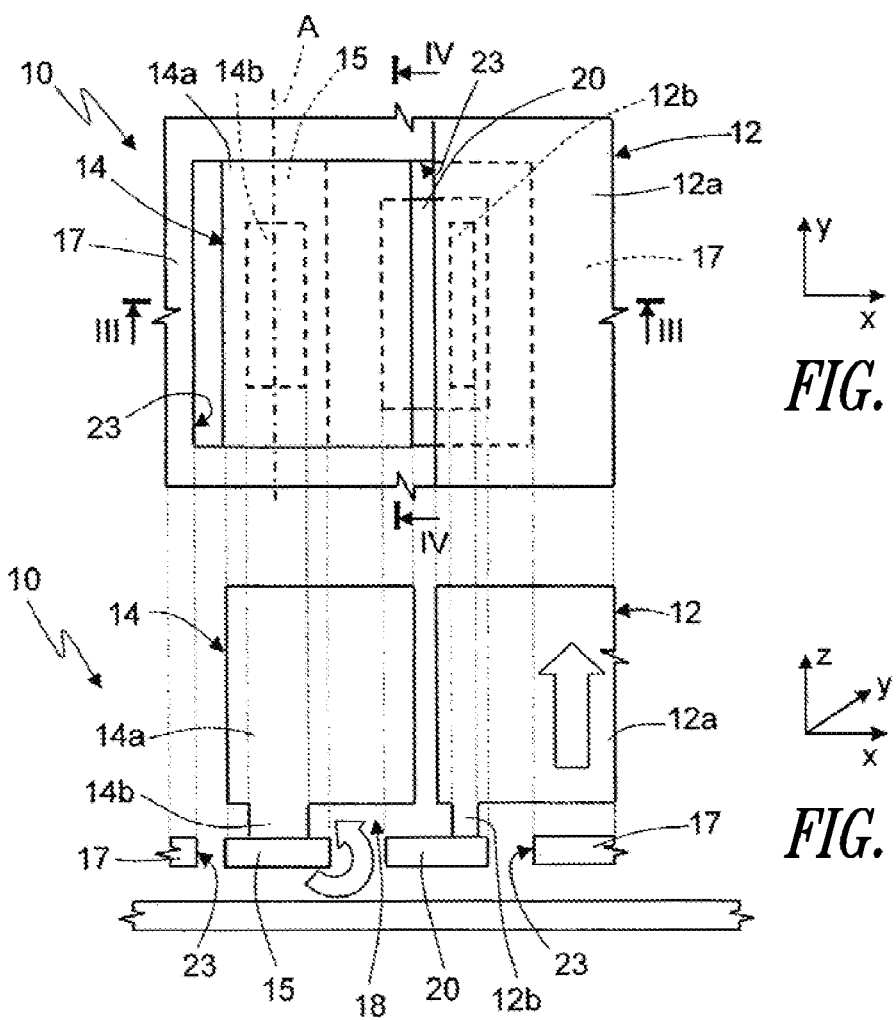
FIG. 3B
FIG. 3C

PLANAR MICROELECTROMECHANICAL DEVICE HAVING A STOPPER STRUCTURE FOR OUT-OF-PLANE MOVEMENTS

BACKGROUND

1. Technical Field

The present disclosure relates to a planar microelectromechanical device having a stopper structure for out-of-plane movements.

2. Description of the Related Art

Microelectromechanical devices (of a MEMS type), in particular inertial sensors, accelerometers, gyroscopes, etc., are known which base their operation on the presence of suspended structures of semiconductor material, fixed to a substrate at one or more anchorage points and mobile along one or more axes. In particular, the suspended structures form one or more mobile masses, which undergo displacements with respect to the substrate in presence of external stimuli. In the case of sensing structures (for example, accelerometers), first electrodes are associated with the mobile masses and face second electrodes, which are fixed with respect to the substrate, so as to form sensing capacitors, the capacitance of which varies with the displacement of the mobile mass. A suitable electronic interface is able to detect, on the basis of the variation of said capacitance, the displacement of the mobile mass, and thus to go back to a quantity to be determined (for example, an acceleration).

FIG. 1 is a schematic illustration of an embodiment of a planar microelectromechanical device, designated by 1 (in particular, by the term "planar" is meant herein a structure that extends principally in a plane xy and is obtained with a substantially planar manufacturing process). The microelectromechanical device 1 comprises a mobile mass 2, of an inertial type, suspended over a substrate 3, for example, of semiconductor material, and connected to a fixed element 4 via elastic elements 5. The fixed element 4 is fixedly anchored to the substrate 3 via an anchorage region 6, arranged between the substrate and the fixed element. The elastic elements 5 are configured so as to enable the mobile mass 2 to perform an operative movement in one or more directions, for example, along a first axis x and a second axis y orthogonal to one another and defining the xy plane, for example as a function of an acceleration acting on the structure.

In a known way, in use, on account of an external event, for example a shock, the mobile mass 2 can moreover undergo a spurious displacement (i.e., one not linked to operation of the structure) of a considerable amount outside the plane xy along a third axis z, orthogonal to the first and second axes x, y and forming therewith a set of three Cartesian axes. This displacement can, in the worst case, even cause failure of the elastic elements 5, and/or damage to other elements of the microelectromechanical device 1 (for example, the mobile mass 2).

For this reason, a stopper structure 7 is generally provided to limit the movements of the mobile mass 2 along the third axis z, in particular the spurious movements due to external events, and thus prevent any undesirable failure. In detail, the microelectromechanical device is enclosed in a package 8, and has at least one internal face 8a facing a top face 2a of the mobile mass 2. The stopper structure 7 comprises a depression of the package 8, which is located on the internal face 8a and extends towards the top face 2a of the mobile mass 2. The stopper structure 7 reduces the range of the movement along the third axis z of the mobile mass 2, which comes to a stop bearing upon the depression of the package, thus reducing any risk of damage.

However, the depression, which is located close to the mobile mass 2 (in order to limit the range of its movement along the third axis z), gives rise to an undesirable electrostatic interaction with the mobile mass, which can cause undesired displacements thereof and in general malfunctioning of the microelectromechanical device 1. In fact, the package (and consequently the depression coupled thereto) are generally maintained either at a floating potential, and hence not at the same potential as the mobile mass, or at a fixed potential, while the mobile mass is supplied with different potentials according to the operating condition. In any case, the undesired displacements can alter operative displacements of the mobile mass 2 that occur in response to external forces (for example, an acceleration that is to be determined). On the other hand, since the manufacturing process of the microelectromechanical device is a basically planar process, where it is simple to create structures in the xy plane, is not equally simple to obtain them along the third axis z, so that up to now there do not exist valid alternatives to the use of depressions in the package.

BRIEF SUMMARY

One embodiment is a microelectromechanical device having a stopper structure that enables the above disadvantages to be overcome.

One embodiment is a microelectromechanical device that includes a mobile mass configured to undergo a first movement in a first direction in response to an external event; and a stopper structure configured to stop the first movement. The stopper structure includes a stopper mass, and a stopper element fixedly coupled to the mobile mass and configured to abut against the stopper mass in response to, and thereby stop, the first movement.

One embodiment is a process for manufacturing a microelectromechanical device that includes: forming a mobile mass configured to undergo a first movement in a first direction in response to an external event; and forming a stopper structure configured to stop the first movement. Forming the stopper structure includes: forming a stopper mass, and fixedly coupling a stopper element to the mobile mass. The stopper element is configured to abut against the stopper mass in response to, and thereby stop, the first movement.

BRIEF DESCRIPTION OF THE SEVERAL VIEWS OF THE DRAWINGS

For a better understanding of the present disclosure, preferred embodiments are now described, purely by way of non-limiting example and with reference to the attached drawings, wherein:

FIG. 2b is a schematic illustration of an enlargement of a detail of FIG. 2a;

FIG. 3a is a plan view of the layout of a portion of a microelectromechanical device and of a corresponding stopper structure, according to a second embodiment;

FIG. 3b is a schematic illustration of an enlargement of a detail of FIG. 3a;

FIG. 3c is a cross-section through the microelectromechanical device, taken along the line of section III-III of FIGS. 3a and 3b;

DETAILED DESCRIPTION

Figure 1:
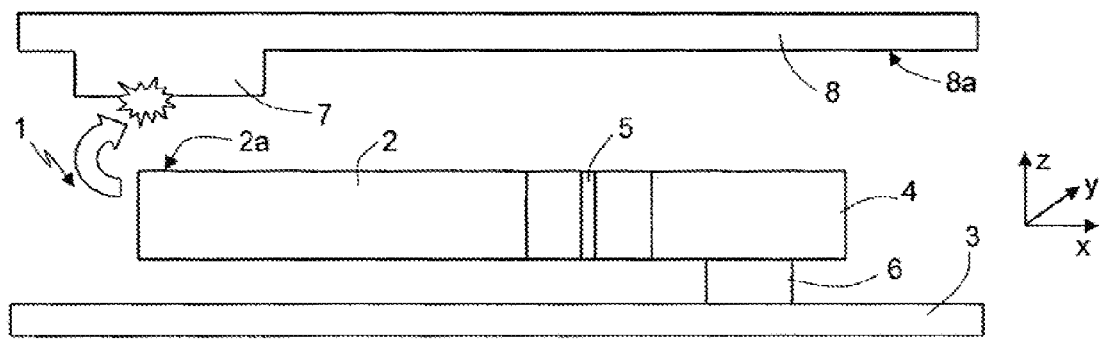
FIG. 1 is a schematic cross-section of a planar microelectromechanical device and of a corresponding stopper structure, of known type.

In detail, and with reference first to FIGS. 2a-2c and FIG. 6, a microelectromechanical device 10 comprises a mobile mass 12, in particular an inertial mass (whereof the figures show only one facing portion 12a, for example a terminal edge portion, designed to co-operate, as described hereinafter, with a stopper structure). The mobile mass 12 is suspended over a substrate 13, for example of semiconductor material, and is supported by elastic elements 5 (see FIG. 6, which correspond to the elastic elements 5 of FIG. 1) anchored to the substrate 13 so as to be free to move in one or more operative directions, for example, along a first axis x and/or a second axis y defining a main plane of extension of the mobile mass.

The microelectromechanical device 10 further comprises a stopper mass 14, which is arranged facing the mobile mass 12 in a direction parallel to the xy plane, in particular to its facing portion 12a, by means of a respective facing portion 14a, and is anchored to the substrate 13, in a fixed way. The stopper mass 14 has at the bottom (along a third axis z forming with the first and second axes x, y a set of three Cartesian axes, and in the direction of the substrate 13) a connecting portion 14b connected to, and arranged on top of, a first biasing region 15, for example of polysilicon. In turn, the first biasing region 15 is arranged on top of an insulating region 16, for example of silicon oxide, formed directly on top of the substrate 13 and having the function of anchorage for the stopper mass 14. The connecting portion 14b has in a plan view (in a plane parallel to the plane xy) smaller dimensions with respect to corresponding dimensions of the facing portion 14a, so that an end region 14c of the facing portion 14a, facing the mobile mass 12, extends in cantilever fashion over the substrate 13, from which it is separated by an empty region 18. The mobile mass 12 has at the bottom a respective connecting portion 12b, connected to the facing portion 12a and having in plan view a generally rectangular shape, elongated along the axis y.

The biasing region 15 is connected in an integral way with an electrode layer 17, underlying the xy plane of the mobile mass 12, which biases (in a way not shown) the mobile mass 12. It follows that the mobile mass 12 and the stopper mass 14 are maintained at the same electrical potential.

According to one embodiment, a stopper element 20 is directly coupled to the mobile mass 12 and concurs to stop a movement of the mobile mass outside the plane xy along the third axis z, in particular a spurious movement due, for example, to a shock undergone by the microelectromechanical device 10. In detail, the stopper element 20, for example of polysilicon, is arranged underneath the mobile mass 12 (in particular, on the opposite side along the third axis z with respect to the direction of the above spurious movement, thereby preceding the mobile mass along said third axis in the direction of the spurious movement) and is connected to the connecting portion 12b. In addition, the stopper element 20 extends parallel to the plane xy in the direction of the stopper mass 14, and in particular within the empty region 18, so as to be partially overlaid by the facing portion 14a of the stopper mass 14. In other words, the stopper element 20 extends within the space underlying the stopper mass 14 along the third axis z.

Figure 2A:
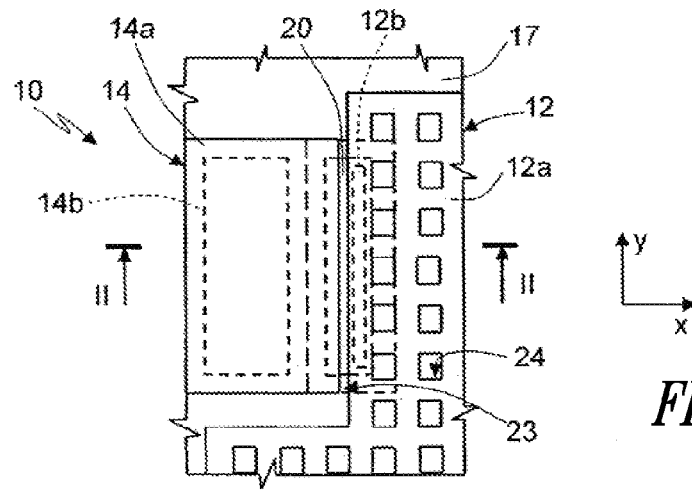
FIG. 2a is a plan view of the layout of a portion of a microelectromechanical device and of a corresponding stopper structure, according to a first embodiment.
Figure 2B:
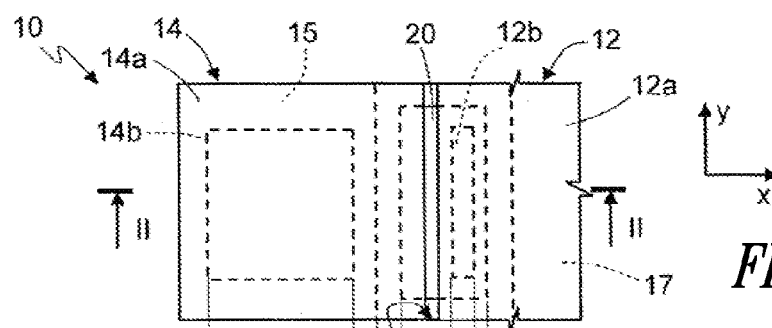
Figure 2C:
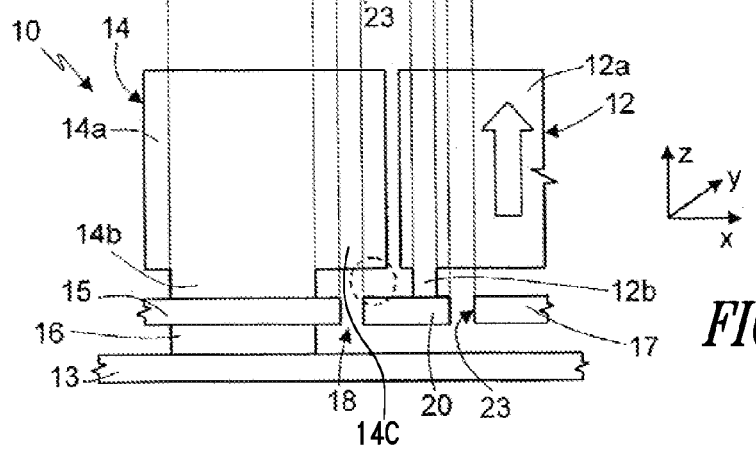
FIG. 2c is a cross-section through the microelectromechanical device, taken along the section line II-II of FIGS. 2a and 2b.

In use, when the mobile mass 12 undergoes a displacement in the direction of the third axis z moving away from the substrate 13 (as highlighted by the arrow of FIG. 2c), the stopper element 20 undergoes a corresponding displacement, abutting against a bottom surface of the facing portion 14a of the stopper mass 14 (in the region highlighted by the dashed circle of FIG. 2c). A physical constraint is thus created, which hinders and stops the movement of the mobile mass 12. In particular, the range of the movement of the mobile mass 12 along the third axis z is limited just to the thickness (along the third axis z) of the connecting portion 12b, thus preventing any possible failure of the microelectromechanical device.

The manufacturing process of the stopper structure, i.e., of the stopper mass 14 and of the stopper element 20, which concurs to stop the movement of the mobile mass 12 out of the xy plane, exploits the same steps of the planar process (of a per se known manner and therefore not described in detail) used for the formation of the microelectromechanical device 10, and in particular of the mobile mass 12 and of corresponding structures associated thereto, for example, the electrode structures, anchorages, elastic suspensions, etc.

In summary, the process envisages first the formation on top of the substrate 13 of a permanent-oxide layer (from which the insulating region 16 will be obtained). Next, the electrode layer 17 is formed on top of the permanent-oxide layer and is then defined so as to form the first biasing region 15 and the stopper element 20 (as well as, in a known way, further biasing regions or electrode regions of the microelectromechanical device 10). In particular, the biasing region 15 has a structure that is continuous with the electrode layer 17 (to which it is connected on three sides in the plane xy), and the stopper element 20 is separated from the biasing region 15 and from the electrode layer 17 by an opening 23, which surrounds it completely.

Next, a sacrificial-oxide layer is formed on top of the electrode layer 17 and is etched at the regions where the connecting portions 12b, 14b are to be formed. An epitaxial growth is now carried out to form, on top of the sacrificial-oxide layer, a structural layer, which is then etched to define the mobile mass 12 and the stopper mass 14 (as well as other fixed or mobile masses of the microelectromechanical device 10). In particular, a plurality of openings 24 is formed through the mobile mass 12, useful for a subsequent removal of the sacrificial oxide so as to free the mobile mass 12. This etch also leads to the removal of the permanent oxide, except from the areas where it is used for support, for example underneath the first biasing region 15.

Consequently, the stopper mass 14 is formed in the same structural layer of the mobile mass 12, and the stopper element 20 is formed in the same electrode layer 17 of the biasing region 15 (and consequently they are both at the same level with respect to the substrate 13 along the third axis z).

A second embodiment, illustrated in FIGS. 3a-3c, differs from the one described above in that the stopper mass 14 is only partially fixed, and has a certain freedom of movement (as described hereinafter) in order to dampen any impact received by the stopper element.

In detail, the biasing region 15 has, in this case, a smaller width along the first axis x and assumes the shape of an elongated strip extending along the second axis y, and is detached laterally at both sides (once again along the first axis x), by the presence of the opening 23, from the electrode layer 17, to which it is connected only along the second axis y (at two opposite smaller sides thereof). In addition, the biasing region 15 is not directly anchored to the substrate 13 underneath the connecting portion 14b of the stopper mass 14. Consequently, the biasing region 15 is flexible and free to twist about an axis of torsion A parallel to the second axis y and joining the contact regions with the electrode layer 17. Accordingly, also the connecting portion 14b of the stopper mass 14 has a reduced width. In addition, in this case, the stopper mass 14 has a respective plurality of openings 24, through which etching of the underlying sacrificial oxide and permanent oxide is carried out so as to remove them underneath the biasing region 15.

In this embodiment, when the stopper element 20 contacts the stopper mass 14, on account of the displacement of the mobile mass 12 along the third axis z, for example due to a shock, the biasing region 15 and the stopper mass 14 undergo a torsion about the axis of torsion A in a corresponding direction (indicated by the arrow in FIG. 3c) so as to absorb, at least partially, the impact. This possibility of torsion of the biasing region 15 enables a considerable reduction in the stresses acting on the structure (concentrated at the boundary between the biasing region 15 and the connecting portion 14b of the stopper mass 14, and in the points of contact of the biasing region with the electrode layer 17), and hence a considerable reduction in the possibility of failure of the structure.

Figure 4:
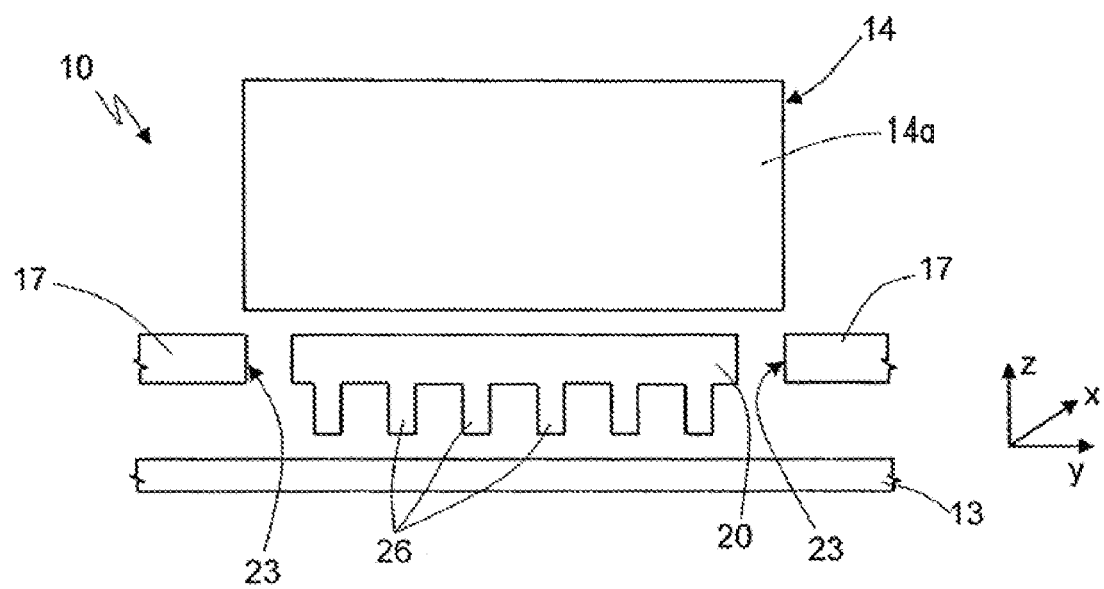
FIG. 4 is a cross-section through the microelectromechanical device, taken along the section line IV-IV of FIGS. 3a and 3b, corresponding to one embodiment.

A variant, shown in FIG. 4 (which regards the second embodiment, but it will be evident that what is described hereinafter can be applied to both of the embodiments), envisages that the stopper element 20 will present at the bottom a series of reinforcement portions 26 (in the form of cross members) so as to increase the strength thereof and thus reduce the risk of failure on account of impact against the stopper mass 14. In detail, the reinforcement portions 26, of the same material as the stopper element 20 (in the example polysilicon), extend throughout the width of the stopper element 20 along the first axis x, are arranged at the same distance apart from one another along the second axis y, and extend underneath the stopper element towards the substrate 13.

The microelectromechanical device described and the corresponding manufacturing process have the following advantages.

First, a stopper structure is provided for the out-of-plane movement of the mobile mass 12 which markedly reduces any risk of failure of the structure following upon any external shock. The stopper structure is obtained via a planar process, using process steps in common with the ones used to obtain the mobile and fixed masses of the device. In particular, the stopper element 20 is formed in the same electrode layer 17 of the biasing region 15 associated with the stopper mass 14, while the stopper mass 14 is formed in the same structural layer of the mobile mass 12.

Advantageously, it is not necessary to introduce depressions in a corresponding package, thus simplifying considerably the manufacturing process thereof, and preventing the risk of any undesirable electrostatic interactions (which is negligible in the structure described, given that the mobile mass 12 and the stopper mass 14 are maintained at the same potential). Thanks to the structure described, the package can be arranged at a distance such as to render the electrostatic coupling with the mobile mass altogether negligible.

Figure 5:
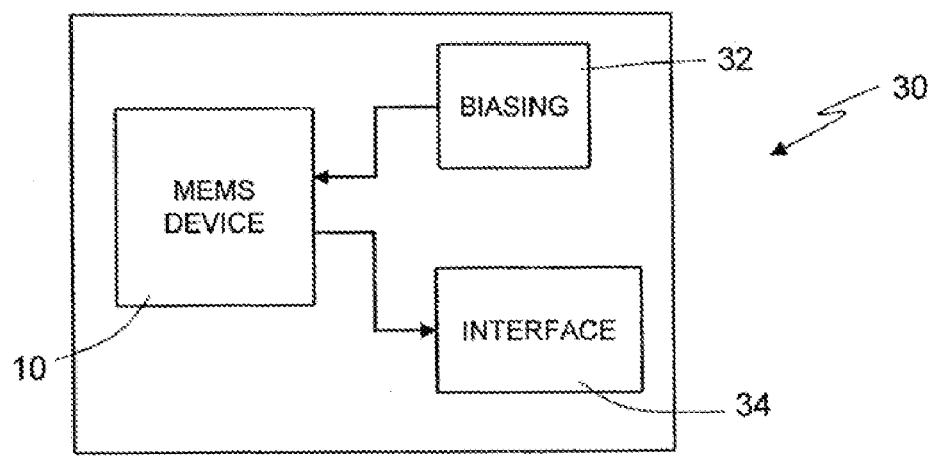
FIG. 5 shows a block diagram of an electronic apparatus according to one embodiment.
Figure 6:
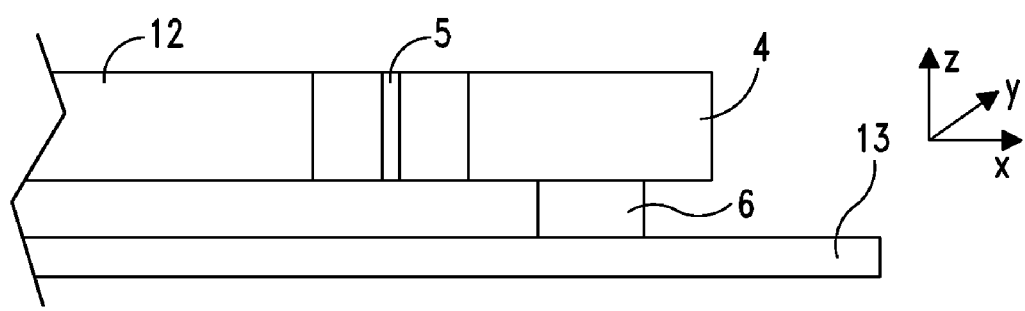
FIG. 6 is a schematic illustration of an enlargement of a detail of FIG. 2A.

The above described solutions are particularly advantageous in an electronic apparatus 30 (FIG. 5) comprising: a microelectromechanical device 10 (of the type described previously); a biasing circuit 32, designed to supply electrical biasing quantities to the microelectromechanical device 10 (in a per se known manner and therefore not described in detail); and an interface circuit 34, designed to be interfaced with the microelectromechanical device 10 for reading one or more electrical quantities associated therewith (in a per se known manner and hence not described in detail).

Finally, it is clear that modifications and variations can be made to what has been described and illustrated herein, without thereby departing from scope of the present disclosure.

In particular, the described structure is well suited for stopping a movement (in particular a spurious movement) of a mobile mass in any direction, envisaging a stopper element coupled to the mobile mass, arranged on the opposite side of a stopper mass fixed with respect to a direction of the spurious movement, and extending in the space occupied by the stopper mass in the direction of the same spurious movement, in such a way as abut against the stopper mass, the distance between the stopper mass and the stopper element at rest determining the range of the spurious movement prior to its arrest.

In addition, the mobile mass can also be provided with an operative movement along the third axis z (direction of the spurious movement). In this case, the range of the movement in this direction, prior to arrest, is fixed to a value higher with respect to a maximum displacement linked to the operative movement.

The mobile mass 12 and the stopper mass 14 can possibly be arranged in a different way from what is illustrated, for example not facing, or facing only partially, the xy plane. The stopper element 20 has, in this case, a structure such as to extend in any case in the space occupied by the stopper mass (as described previously) in order to strike said stopper mass during the spurious movement. The facing portion 12a of the mobile mass 12 could moreover not be arranged on the edge of said mass, but, for example, be arranged inside, facing a cavity in which the stopper mass 14 is housed.

Finally, it is clear that the arrangements described above can be applied to various types of microstructures, such as, for example, gyroscopes, inertial sensors and linear or rotational accelerometers, or more in general to all the microstructures that present a mobile mass of an inertial type, irrespective of the manufacturing process and the materials used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
a substrate;
a mobile mass flexibly coupled to the substrate and configured to undergo a first movement in a first direction in response to an external event;
a stopper mass; and
a stopper element fixedly coupled to said mobile mass and configured to abut against the stopper mass in response to, and thereby stop, said first movement, wherein the stopper mass is flexibly coupled to the substrate to dampen an impact with said stopper element caused by the first movement of the mobile mass, the stopper element including:
a main portion extending laterally under the stopper mass; and a plurality of reinforcement portions each having a free end extending from a surface of the main portion toward the substrate.

2. The device according to claim 1, wherein said mobile mass extends principally in a plane, and said first direction extends outside and in a direction transverse to said plane; said mobile mass being moreover configured so as to perform a second movement, in particular an operative movement, in at least one second direction parallel to said plane, said first movement being a spurious movement.

3. The device according to claim 1, wherein said mobile mass is an inertial mass anchored to said substrate through elastic suspension elements.

4. The device according to claim 1, wherein said stopper element is arranged on a lower side of said mobile mass, and extends below said stopper mass.

5. The device according to claim 4, wherein a distance between said stopper mass and said stopper element in a resting condition determines a range of said first movement, prior to its arrest.

6. The device according to claim 4, wherein said mobile mass comprises a connecting portion extending on the lower side of said mobile mass, and said stopper element extends from said connecting portion in a direction transverse to said first direction; a dimension of said connecting portion in said first direction determining a range of said first movement.

7. The device according to claim 1, further comprising a biasing region supporting the stopper mass, wherein said mobile mass and biasing region are configured to have a same electrical biasing.

8. The device according to claim 7, wherein said stopper element and said biasing region are defined in a same electrode layer, and said stopper element is separated from said biasing region by an opening in said electrode layer.

9. The device according to claim 7, wherein:
said stopper mass comprises a connecting portion extending on a lower side of said stopper mass and connected to said biasing region; said connecting portion having in plan view smaller dimensions than said stopper mass so that said stopper mass has a cantilever portion extending in cantilever fashion beyond the connecting portion; and
said stopper element extends below said cantilever portion.

10. The device according to claim 7, further comprising a connecting portion of insulating material that directly connects said biasing region to the substrate.

11. The device according to claim 7, wherein said biasing region has an elongated strip shape extending between two ends and is structured to twist about an axis of torsion extending through said two ends, and said stopper mass is structured to dampen the impact with said stopper element through a corresponding torsion about said axis of torsion.

12. The device according to claim 7, wherein said stopper element is arranged between said substrate and said stopper mass, partially faces said stopper mass in said first direction, and is configured to bear upon a surface of said stopper mass facing said substrate.

13. The device according to claim 12, wherein said mobile mass extends mainly in a plane and said first direction is transverse to said plane; said mobile mass and said stopper mass facing each other in a direction parallel to said plane and being arranged at a same level with respect to said substrate in said first direction.

14. An electronic apparatus, comprising:
an interface device; and
a microelectromechanical device coupled to the interface device and including:
a substrate;
a mobile mass flexibly coupled to the substrate and configured to undergo a first movement in a first direction in response to an external event;
a stopper mass; and
a stopper element fixedly coupled to said mobile mass and configured to abut against the stopper mass in response to, and thereby stop, said first movement, wherein the stopper mass is flexibly coupled to the substrate to dampen an impact with said stopper element caused by the first movement of the mobile mass, the stopper element including:
a main portion extending laterally under the stopper mass; and
a plurality of reinforcement portions each having a free end extending from a surface of the main portion toward the substrate.

15. The apparatus of claim 14 wherein said microelectromechanical device is selected from one from among an accelerometer, a gyroscope, and an inertial sensor.

16. The apparatus of claim 14, wherein said mobile mass extends principally in a plane, and said first direction extends outside and in a direction transverse to said plane; said mobile mass being moreover configured so as to perform a second movement, in particular an operative movement, in at least one second direction parallel to said plane, said first movement being a spurious movement.

17. The apparatus of claim 14 wherein the microelectromechanical device includes a biasing region supporting the stopper mass, wherein said mobile mass and biasing region are configured to have a same electrical biasing.

18. The apparatus of claim 17, wherein said stopper element and said biasing region are defined in a same electrode layer, and said stopper element is separated from said biasing region by an opening in said electrode layer.

19. The apparatus of claim 17, wherein:
said stopper mass comprises a connecting portion extending on a lower side of said stopper mass and connected to said biasing region; said connecting portion having in plan view smaller dimensions than said stopper mass so that said stopper mass has a cantilever portion extending in cantilever fashion beyond the connecting portion; and
said stopper element extends below said cantilever portion.

20. The apparatus of claim 17, wherein said biasing region has an elongated strip shape extending between two ends and is structured to twist about an axis of torsion extending through said two ends, and said stopper mass is structured to dampen the impact with said stopper element through a corresponding torsion about said axis of torsion.

21. A process, comprising:
manufacturing a microelectromechanical device, the manufacturing including:
forming a mobile mass flexibly coupled to a substrate and configured to undergo a first movement in a first direction in response to an external event;
forming a stopper mass; and
forming a stopper element fixedly coupled to said mobile mass and configured to abut against the stopper mass in response to, and thereby stop, said first movement, wherein the stopper mass is flexibly coupled to the substrate to dampen an impact with said stopper element caused by the first movement of the mobile mass, the forming of the stopper element including:
forming a main portion extending laterally under the stopper mass; and forming a plurality of reinforcement portions each having a free end extending from a surface of the main portion toward the substrate.

22. The process according to claim 21, wherein forming said stopper mass further comprises forming said stopper mass in a same structural layer as said mobile mass.

23. The process according to claim 21, further comprising:
forming a biasing region coupled to said stopper mass;
forming said biasing region and said stopper element by defining a same electrode layer.

24. The process according to claim 23, wherein defining said electrode layer comprises forming an opening between said stopper element and said biasing region.

25. The process according to claim 23, wherein, said biasing region has an elongated strip shape extending between two ends and is structured to twist about an axis of torsion extending through said two ends, and said stopper mass is structured to dampen the impact with said stopper element through a corresponding torsion about said axis of torsion.

26. A microelectromechanical device, comprising:
a substrate;
a mobile mass flexibly coupled to the substrate and configured to undergo a first movement in a first direction in response to an external event;
a biasing region having the same electrical biasing as the mobile mass, the biasing region having an elongated strip shape extending between two ends and being structured to twist about an axis of torsion extending through the two ends;
a stopper mass supported by the biasing region;
a stopper element fixedly coupled to the mobile mass and configured to abut against the stopper mass in response to, and thereby stop, the first movement, wherein the stopper mass is flexibly coupled to the substrate to dampen an impact with the stopper element caused by the first movement of the mobile mass, through a corresponding torsion about the axis of torsion.

27. The device according to claim 26 wherein the mobile mass is an inertial mass anchored to the substrate through elastic suspension elements.

28. The device according to claim 26 wherein the stopper element is arranged on a lower side of the mobile mass, and extends below the stopper mass.

29. An electronic apparatus, comprising:
an interface device; and
a microelectromechanical device coupled to the interface device, the microelectromechanical device including:
a substrate;
a mobile mass flexibly coupled to the substrate and configured to undergo a first movement in a first direction in response to an external event;
a biasing region having a same electrical biasing as the mobile mass, the biasing region having an elongated strip shape extending between two ends and being structured to twist about an axis of torsion extending through the two ends;
a stopper mass supported by the biasing region; and
a stopper element fixedly coupled to the mobile mass and configured to abut against the stopper mass in response to, and thereby stop, the first movement, wherein the stopper mass is flexibly coupled to the substrate to dampen an impact with the stopper element caused by the first movement of the mobile mass through a corresponding torsion about the axis of torsion.

30. The apparatus according to claim 29 wherein the mobile mass is an inertial mass anchored to the substrate through elastic suspension elements.

31. The apparatus according to claim 30 wherein the stopper element is arranged on a lower side of the mobile mass, and extends below the stopper mass.

32. A process, comprising:
manufacturing a microelectromechanical device, the manufacturing including:
forming a mobile mass flexibly coupled to a substrate and configured to undergo a first movement in a first direction in response to an external event;
forming a stopper mass;
forming a biasing region from an electrode layer, the forming of the biasing region including:
forming the biasing region to have an elongated strip shape extending between two ends, the biasing region being structured to twist about an axis of torsion extending through said two ends; and
coupling the biasing region to the stopper mass; and
forming a stopper element from the electrode layer, the stopper element fixedly coupled to said mobile mass and configured to abut against the stopper mass in response to, and thereby stop, said first movement, wherein the stopper mass is flexibly coupled to the substrate to dampen an impact with said stopper element caused by the first movement of the mobile mass through a corresponding torsion about said axis of torsion.

33. The process according to claim 32, further comprising coupling the mobile mass to the substrate by forming elastic suspension elements between the mobile mass and the substrate.

34. The process according to claim 32, further comprising forming the stopper element on a lower side of the mobile mass extending below the stopper mass.

* * * * *